(12) United States Patent
Umetsu et al.

(10) Patent No.: US 6,596,634 B2
(45) Date of Patent: Jul. 22, 2003

(54) WIRING BOARD AND FABRICATING METHOD THEREOF, SEMICONDUCTOR DEVICE AND FABRICATING METHOD THEREOF, CIRCUIT BOARD AND ELECTRONIC INSTRUMENT

(75) Inventors: Kazushige Umetsu, Chino (JP); Yohei Kurashima, Chino (JP); Jun Amako, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/077,820

(22) Filed: Feb. 20, 2002

(65) Prior Publication Data

US 2002/0127839 A1 Sep. 12, 2002

(30) Foreign Application Priority Data

Mar. 7, 2001 (JP) ........................................ 2001-063650

(51) Int. Cl.[7] ............................................... H01L 21/44
(52) U.S. Cl. ...................... 438/666; 438/618; 257/773; 257/774
(58) Field of Search ................................. 438/666, 618; 257/773, 774

(56) References Cited

U.S. PATENT DOCUMENTS 6,284,308 B2 * 9/2001 Seki et al. ..................... 427/97

* cited by examiner

Primary Examiner—David Nelms
Assistant Examiner—Tu-Tu Ho
(74) Attorney, Agent, or Firm—Oliff & Berridge, PLC

(57) ABSTRACT

A conductive material is provided to an open end of a penetrating hole penetrating through at least a semiconductor element, on the side of a first surface of the semiconductor element. The conductive material is melted to flow into the penetrating hole. The conductive material is made to flow into the penetrating hole in a state that an atmospheric pressure on the side of a second surface of the semiconductor element opposite to the first surface is lower than an atmospheric pressure on the side of the first surface.

16 Claims, 8 Drawing Sheets

US 6,596,634 B2

WIRING BOARD AND FABRICATING METHOD THEREOF, SEMICONDUCTOR DEVICE AND FABRICATING METHOD THEREOF, CIRCUIT BOARD AND ELECTRONIC INSTRUMENT

Japanese Patent Application No. 63650/2001 filed on Mar. 7, 2001, is hereby incorporated by reference in its entirety.

BACKGROUND OF THE INVENTION

This invention relates to a wiring board and a fabricating method thereof, a semiconductor device and a fabricating method thereof, a circuit board and an electronic instrument.

A form that electrically connects both surfaces of a semiconductor chip by boring penetrating holes in the semiconductor chip, forms an insulating film and then forms either wet or dry an electrically conductive film, or filling penetrating holes with molten solder is known. Since this method eliminates the necessity for disposing wires, a compact semiconductor device can be acquired even when a plurality of semiconductor chips is stacked one upon another.

However, the process step of filling penetrating holes with a conductive material is often time consuming and troublesome. A method that forms a film by means such as photolithography and renders the resulting film electrically conductive needs a large number of process steps, a long time and a high cost of production. A method of filling penetrating holes of a wiring board with a conductive material is also known, but the method needs a long time and troublesome procedures.

SUMMARY OF THE INVENTION

According to a first aspect of the present invention, there is provided a method of fabricating a semiconductor device comprising the steps of:

providing a conductive material to an open end of a penetrating hole penetrating through at least a semiconductor element, on the side of a first surface of the semiconductor element; and melting the conductive material to make the conductive material flow into the penetrating hole, wherein the conductive material is made to flow into the penetrating hole in a state that an atmospheric pressure on the side of a second surface of the semiconductor element opposite to the first surface is lower than an atmospheric pressure on the side of the first surface.

According to a second aspect of the present invention, there is provided a method of fabricating a stacked type semiconductor device comprising the steps of:

forming a plurality of semiconductor devices each of which is formed by: providing a conductive material to an open end of a penetrating hole penetrating through at least a semiconductor element, on the side of a first surface of the semiconductor element; melting the conductive material to make the conductive material flow into the penetrating hole; and causing the conductive material to flow into the penetrating hole in a state that an atmospheric pressure on the side of a second surface of the semiconductor element opposite to the first surface is lower than an atmospheric pressure on the side of the first surface;

stacking the plurality of the semiconductor devices; and electrically connecting the semiconductor elements of the stacked semiconductor devices through the conductive material.

According to a third aspect of the present invention, there is provided a semiconductor device or a stacked type semiconductor device fabricated by any of the above methods.

According to a fourth aspect of the present invention, there is provided a semiconductor device comprising:

a semiconductor element having a pad and a penetrating hole penetrating through the pad and the semiconductor element; and a conductive material that is provided in an area including an inner surface of the penetrating hole and is electrically connected to the pad, wherein part of the conductive material forms a bump protruding from a surface of the semiconductor element opposite to a surface having the pad.

According to a fifth aspect of the present invention, there is provided a stacked type semiconductor device comprising a plurality of stacked semiconductor devices each of which includes:

a semiconductor element having a pad and a penetrating hole penetrating through the pad and the semiconductor element; and a conductive material that is provided in an area including an inner surface of the penetrating hole and is electrically connected to the pad, wherein part of the conductive material forms a bump protruding from a surface of the semiconductor element opposite to a surface of the semiconductor element having the pad; and wherein the semiconductor elements of the stacked semiconductor devices are electrically connected through the conductive material.

A circuit board according to a sixth aspect of the present invention comprises the semiconductor device or the stacked type semiconductor device described above.

An electronic instrument according to a seventh aspect of the present invention comprises the semiconductor device or the stacked type semiconductor device described above.

According to an eighth aspect of the present invention, there is provided a method of fabricating a wiring board comprising the steps of:

providing a conductive material to an open end of a penetrating hole penetrating through at least a board, on the side of a first surface of the board; and melting the conductive material to make the conductive material flow into the penetrating hole, wherein the conductive material is made to flow into the penetrating hole in a state that an atmospheric pressure on the side of a second surface of the board opposite to the first surface is lower than an atmospheric pressure on the side of the first surface.

A wiring board according to a ninth aspect of the present invention is fabricated by the above described method.

DETAILED DESCRIPTION OF THE EMBODIMENTS

Figure 1A:
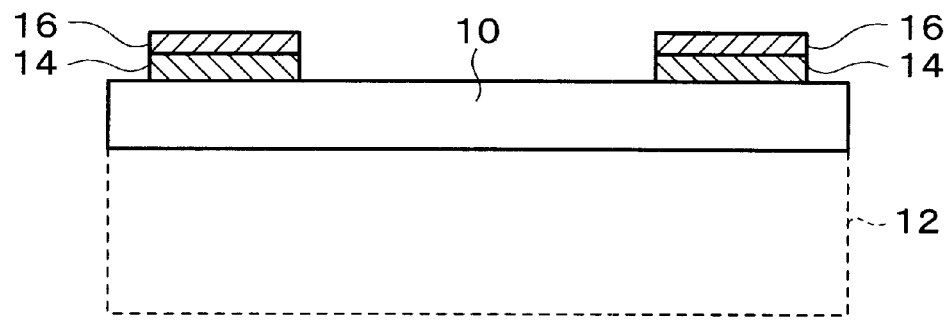
FIGS. 1A to 1C show a fabrication method of a semiconductor device according to the first embodiment of the present invention.

Embodiments of the present invention may solve the problems described above, and provide a wiring board and its fabrication method, a semiconductor device and its fabrication method, a circuit board and an electronic instrument, all of which are capable of easily providing an electrically conductive material in a penetrating hole.

(1) According to one embodiment of the present invention, there is provided a method of fabricating a semiconductor device comprising the steps of:

providing a conductive material to an open end of a penetrating hole penetrating through at least a semiconductor element, on the side of a first surface of the semiconductor element; and melting the conductive material to make the conductive material flow into the penetrating hole, wherein the conductive material is made to flow into the penetrating hole in a state that an atmospheric pressure on the side of a second surface of the semiconductor element opposite to the first surface is lower than an atmospheric pressure on the side of the first surface.

According to this embodiment, the molten conductive material flows into the penetrating hole toward the side of the second surface having a lower atmospheric pressure than the side of the first surface. The conductive material can be made to flow in a short time into the penetrating hole by controlling the difference of atmospheric pressure.

(2) In this method of fabricating a semiconductor device, the semiconductor element may have a pad formed on the first surface; and the penetrating hole may penetrate through the pad.

(3) In this method of fabricating a semiconductor device, a conductive film extending from the pad into an inner surface of the penetrating hole may be formed before the conductive material is provided.

The pad and the conductive material can be thus reliably connected.

(4) In this method of fabricating a semiconductor device, the conductive material may be a solid, and the solid conductive material may be placed over the open end of the penetrating hole on the side of the first surface.

Since it is only necessary to place the solid conductive material over the penetrating hole, the stress resulting from pressurization does not act on the semiconductor element, and damage can be prevented.

(5) In this method of fabricating a semiconductor device, the conductive material may be paste-like, and the paste-like conductive material may be applied to the open end of the penetrating hole on the side of the first surface.

(6) In this method of fabricating a semiconductor device, the paste-like conductive material may be applied to the first surface of the semiconductor element.

This configuration makes it possible to provide the conductive material to the open end of the penetrating hole without consideration of the position of the penetrating hole.

(7) In this method of fabricating a semiconductor device, a laser beam may be projected onto the conductive material to melt the conductive material.

Since partial heating can be conducted, it becomes possible to prevent the semiconductor element from being heated to a high temperature. It is effective when there is possibility of damage of the semiconductor element if it is heated as a whole.

(8) In this method of fabricating a semiconductor device, the semiconductor element may be heated to melt the conductive material.

This makes it possible to easily melt the conductive material.

(9) In this method of fabricating a semiconductor device, the conductive material may be made to flow in a state that an atmospheric pressure on the side of the first surface of the semiconductor element is higher than normal atmospheric pressure.

(10) In this method of fabricating a semiconductor device, the conductive material may be made to flow in a state that an atmospheric pressure on the side of the second surface of the semiconductor element is lower than normal atmospheric pressure.

(11) In this method of fabricating a semiconductor device, the conductive material may be made to flow through the penetrating hole and protrude from the second surface into a bump.

When both surfaces of the semiconductor element are electrically connected by the conductive material, the bump can be formed in the semiconductor element. Therefore, it is not necessary to provide a step of forming a bump separately.

(12) In this method of fabricating a semiconductor device, the penetrating hole may be formed as a hole in the semiconductor element, an inner wall of the hole being covered by an insulating material; and the diameter of the bump may be smaller than the diameter of the hole.

In this configuration, the bump as a part of the conductive material has a smaller diameter than the diameter of the hole. Therefore, it becomes possible to prevent the bump from swelling out of the area of the insulating material to become electrically conductive with the semiconductor element.

(13) In this method of fabricating a semiconductor device, the semiconductor element may be a semiconductor wafer.

(14) According to one embodiment of the present invention, there is provided a method of fabricating a stacked type semiconductor device comprising the steps of:

forming a plurality of semiconductor devices each of which is formed by: providing a conductive material to an open end of a penetrating hole penetrating through at least a semiconductor element, on the side of a first surface of the semiconductor element; melting the conductive material to make the conductive material flow into the penetrating hole; and causing the conductive material to flow into the penetrating hole in a state that an atmospheric pressure on the side of a second surface of the semiconductor element opposite to the first surface is lower than an atmospheric pressure on the side of the first surface;

stacking the plurality of the semiconductor devices; and electrically connecting the semiconductor elements of the stacked semiconductor devices through the conductive material.

According to this embodiment of the invention, a semiconductor device having a three-dimensional package can be fabricated at a low cost and through a simple process.

(15) According to one embodiment of the present invention, there is provided a semiconductor device or a stacked type semiconductor device fabricated by any of the above described methods.

(16) According to one embodiment of the present invention, there is provided a semiconductor device comprising:

a semiconductor element having a pad and a penetrating hole penetrating through the pad and the semiconductor element; and a conductive material that is provided in an area including an inner surface of the penetrating hole and is electrically connected to the pad, wherein part of the conductive material forms a bump protruding from a surface of the semiconductor element opposite to a surface having the pad.

According to this embodiment, part of the conductive material provided in the penetrating hole protrudes from the surface of the semiconductor element. Therefore, when the protruding portion is used as an external terminal, for example, the number of components of the semiconductor device can be reduced, and its fabrication process can be simplified, too. Therefore, a semiconductor device can be provided with a reduced cost.

(17) In this semiconductor device, the penetrating hole may be formed as a hole in the semiconductor element, an inner wall of the hole being covered by an insulating material; and the diameter of the bump may be smaller than the diameter of the hole.

In this configuration, the bump as a part of the conductive material has a diameter smaller than that of the hole. Therefore, it is possible to prevent the bump from swelling out of the area of the insulating material to become electrically conductive with the semiconductor element.

(18) In this semiconductor device, another part of the conductive material may protrude from the surface having the pad.

This configuration can decrease the number of components of the semiconductor device if the protruding portion is used as an external terminal.

(19) According to one embodiment of the present invention, there is provided a stacked type semiconductor device comprising a plurality of stacked semiconductor devices each of which includes:

a semiconductor element having a pad and a penetrating hole penetrating through the pad and the semiconductor element; and a conductive material that is provided in an area including an inner surface of the penetrating hole and is electrically connected to the pad, wherein part of the conductive material forms a bump protruding from a surface of the semiconductor element opposite to a surface of the semiconductor element having the pad; and wherein the semiconductor elements of the stacked semiconductor devices are electrically connected through the conductive material.

According to this embodiment of the present invention, part of the conductive material provided in the penetrating hole protrudes from the surface of the semiconductor element and this protruding portion electrically connects the upper and lower semiconductor elements with one another. Therefore, the number of components of the semiconductor device can be reduced, the fabrication process can be simplified and eventually, a semiconductor device can be provided with a reduced cost.

(20) A circuit board according to one embodiment of the present invention comprises the semiconductor device or the stacked type semiconductor device described above.

(21) An electronic instrument according to one embodiment of the present invention comprises the semiconductor device or the stacked type semiconductor device described above.

(22) According to one embodiment of the present invention, there is provided a method of fabricating a wiring board comprising the steps of:

providing a conductive material to an open end of a penetrating hole penetrating through at least a board, on the side of a first surface of the board; and melting the conductive material to make the conductive material flow into the penetrating hole, wherein the conductive material is made to flow into the penetrating hole in a state that an atmospheric pressure on the side of a second surface of the board opposite to the first surface is lower than an atmospheric pressure on the side of the first surface.

According to this embodiment of the present invention, the molten conductive material can be made to flow into the penetrating hole toward the side of the second surface having a lower pressure than the side of the first surface. Since this operation is conducted by controlling the pressure difference, the conductive material can be provided in the penetrating hole in a short time.

(23) In this method of fabricating a wiring board, the board may have a land for an interconnecting pattern formed on the first surface; and the penetrating hole may penetrate through the land for the interconnecting pattern.

(24) In this method of fabricating a wiring board, a conductive film extending from the land to an inner surface of the penetrating hole may be formed before the conductive material is provided.

This enables to electrically connect the land to the conductive material reliably.

(25) In this method of fabricating a wiring board, the conductive material may be a solid, and the solid conductive material may be placed over the open end of the penetrating hole on the side of the first surface.

Since it is necessary only to put the solid conductive material over the open end of the penetrating hole, the stress resulting from pressurization does not act on the substrate, and the substrate is not damaged.

(26) In this method of fabricating a wiring board, the conductive material may be paste-like, and the paste-like conductive material may be applied to the open end of the penetrating hole on the side of the first surface.

(27) In this method of fabricating a wiring board, the paste-like conductive material may be applied to the first surface of the board.

This makes it possible to easily provide the conductive material over the open end of the penetrating hole without consideration of the position of the penetrating hole.

(28) In this method of fabricating a wiring board, a laser beam may be projected onto the conductive material to melt the conductive material.

Since partial heating can be conducted, it becomes possible to prevent the substrate from being heated to a high temperature. Therefore, the substrate is not damaged.

(29) In this method of fabricating a wiring board, the board may be heated to melt the conductive material.

This makes it possible to easily melt the conductive material.

(30) In this method of fabricating a wiring board, the conductive material may be made to flow in a state that an atmospheric pressure on the side of the first surface of the board is higher than normal atmospheric pressure.

(31) In this method of fabricating a wiring board, the conductive material may be made to flow in a state that an atmospheric pressure on the side of the second surface of the board is lower than normal atmospheric pressure.

(32) In this method of fabricating a wiring board, the board may have a land for a second interconnecting pattern formed on the second surface; the penetrating hole may penetrate through the land for the second interconnecting pattern; and the conductive material may be electrically connected to the second interconnecting pattern in the step of making the conductive material to flow.

(33) In this method of fabricating a wiring board, the board may be a glass epoxy board.

(34) In this method of fabricating a wiring board, the board may be a polyimide board.

(35) According to one embodiment of the present invention, there is provided a wiring board fabricated by the above described method.

Embodiments of the present invention will now be described in detail with reference to the accompanying drawings. However, the present invention is not limited to the embodiments below.

First Embodiment

Figure 3:
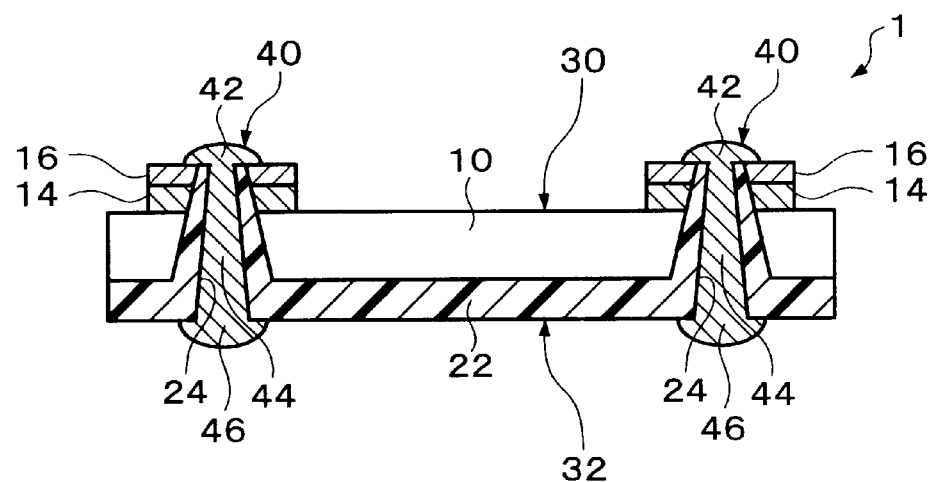
FIG. 3 shows a semiconductor device according to the first embodiment of the present invention.
Figure 4:
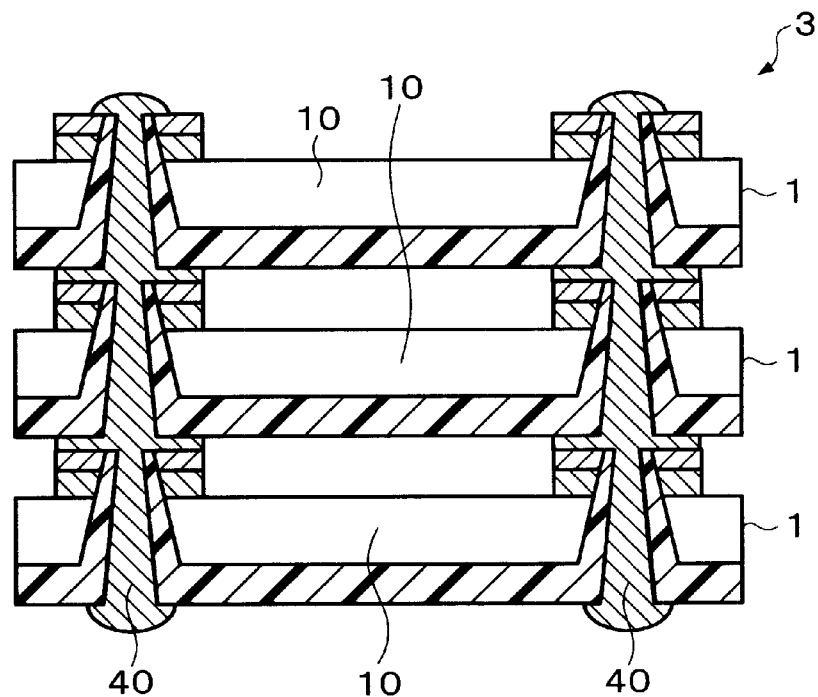
FIG. 4 shows a semiconductor device according to the first embodiment of the present invention.
Figure 5:
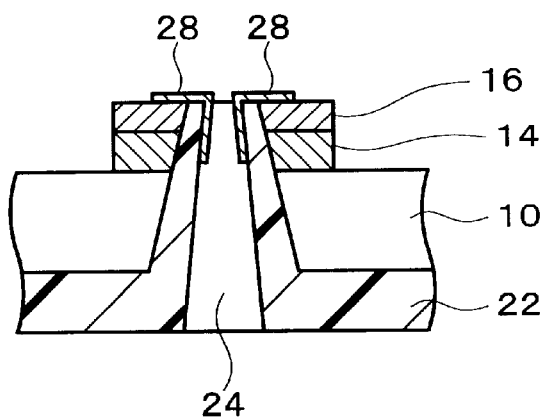
FIG. 5 shows a fabrication method of a semiconductor device according to a modification of the first embodiment of the present invention.
Figure 6:
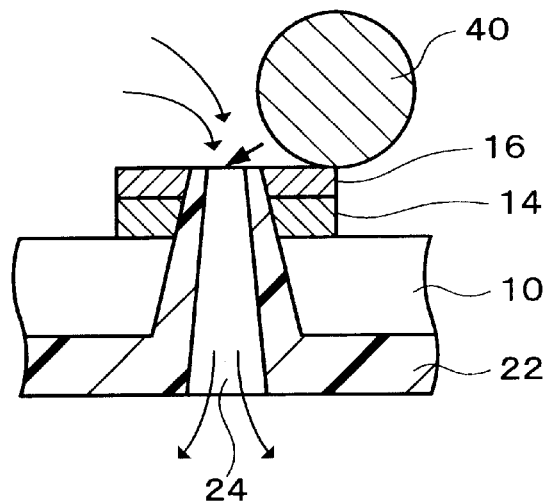
FIG. 6 shows a fabrication method of a semiconductor device according to another modification of the first embodiment of the present invention.
Figure 7:
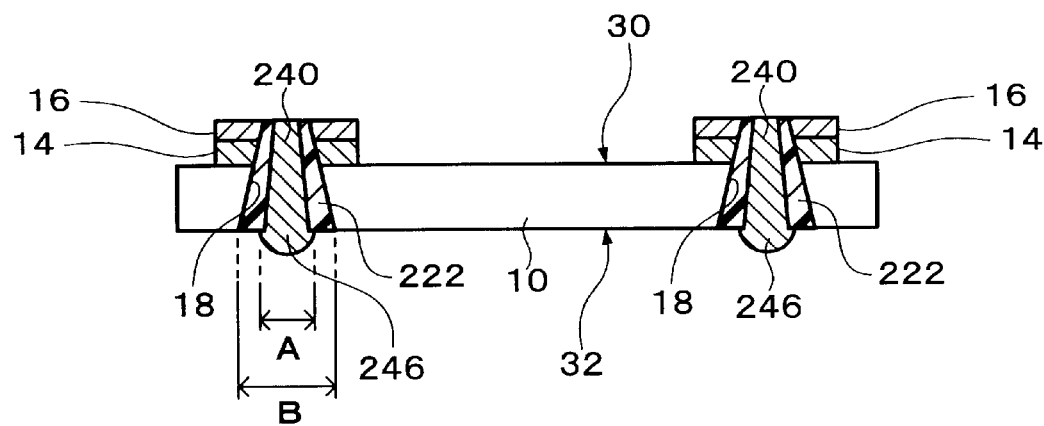
FIG. 7 shows a fabrication method of a semiconductor device according to still another modification of the first embodiment of the present invention.

FIGS. 1A to 2C show a fabrication method of a semiconductor device according to the first embodiment of the invention. FIGS. 3 and 4 show the semiconductor device according to this embodiment. FIGS. 5 to 7 show a semiconductor device and a production method according to modifications of this embodiment. First, penetrating holes 24 are formed in such a fashion as to penetrate through at least a semiconductor chip 10 as shown in FIGS. 1A to 2A.

As shown in FIG. 1A, the semiconductor chip 10 (semiconductor device) is prepared. The semiconductor chip 10 is a rectangle in most case, but its shape is not limited and may be a sphere, for example. The semiconductor chip 10 may be cut to a thickness smaller than that of its original semiconductor chip 12 (or a semiconductor wafer). More specifically, the surface of the semiconductor chip 10 that is opposite to the surface on which an integrated circuit (not shown) is to be formed (active surface) is cut. Cutting of the semiconductor chip 10 may be conducted either before or after dicing of the semiconductor wafer. Alternatively, a method may be employed that forms, from a surface, grooves to a depth greater than the thickness of the semiconductor chip 10 on the semiconductor wafer, and cuts the back of the semiconductor wafer to split the wafer into a plurality of thin semiconductor chips 10.

The semiconductor chip 10 has a plurality of pads 14. Each pad 14 is an electrode of an integrated circuit formed in the semiconductor chip 10. The pad 14 is formed in most cases on the surface of the semiconductor chip 10 having the integrated circuit. The pad 14 is preferably formed on the surface of the semiconductor chip 10 and outside the area of the integrated circuit. Such an arrangement makes it possible to form penetrating holes 24 (see FIG. 2A) that penetrate through the semiconductor chip 10 and through the pads 14 while avoiding the area of the integrated circuit. Alternatively, the pad 14 maybe formed inside the area of the integrated circuit. The pad 14 is made in most cases of aluminum or copper. Note that a passivation film (not shown) may further be formed on the surface of the semiconductor chip 10 on which the pads 14 are formed.

A metal layer 16 may be provided on the electrode 14, whenever necessary. The metal layer 16 can prevent oxidation of the pad 14. The metal layer 16 may use a material having high wettability to solder. When the solder is applied to the pad 14, the molten solder can be provided in the penetrating holes 24 under a satisfactory condition. The material of the metal layer 16 is not limited, and may be a metal containing at least nickel or gold, for example.

Figure 1B:
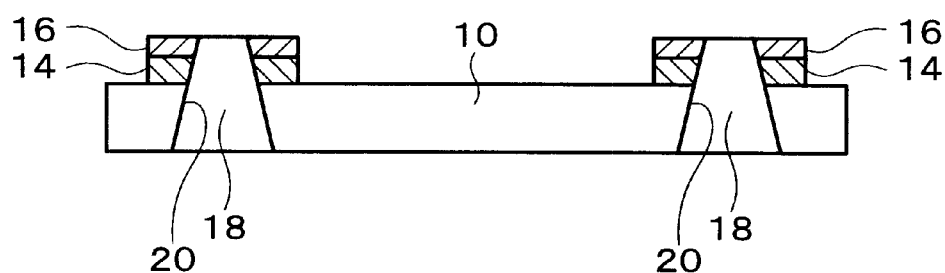

A hole 18 is formed in each semiconductor chip 10 as shown in FIG. 1B. The hole 18 is used to provide an insulating material 22, and is formed in such a fashion as to penetrate through the semiconductor chip 10. Laser (YAG laser or excimer laser) may be used to form the hole 18. A laser beam may be irradiated from the surface of the semiconductor chip having the pads 14 or from the opposite surface to the pads 14. Alternatively, the laser beams may be irradiated from both surfaces (sequentially or simultaneously). It is also possible to form in advance a recess (not shown) at the position of the semiconductor chip 10 at which the hole 18 is formed, and to use the recess as a mark for laser beam irradiation.

A taper 20 may be applied to the hole 18 so that an open width becomes progressively greater away from the pad 14 as shown in the drawings. On the contrary, the taper maybe applied so that the open width becomes progressively smaller away from the pad 14. Further, the hole 18 may have an inner wall surface vertical to the surface of the semiconductor chip 10, separately from the taper.

Figure 1C:
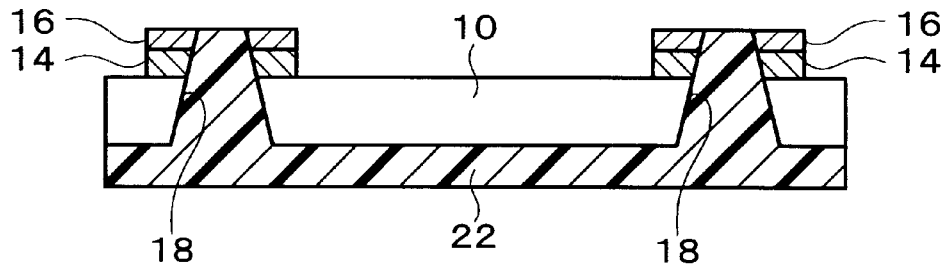

The insulating material 22 is provided in an area inclusive of the inner surface of the hole 18 as shown in FIG. 1C. The insulating material 22 may bury the hole 18, or may be provided on the inner wall surface in such a fashion as to avoid the center axis of the hole 18. In either case, the insulating material 22 may be so provided as to extend to the surface of the semiconductor chip 10 opposite to the surface having the pad 14, whenever necessary. In the example shown in the drawing, the insulating material 22 is provided in such a fashion as to cover the surface of the semiconductor chip 10 inclusive of the inner surface of the hole 18. This arrangement makes it possible to increase the semiconductor chip 10, to improve the strength and to prevent crack. Even when the semiconductor chip 10 expands and is likely to warp due to influences of heat, the insulating material 22 absorbs stress and suppresses the warp. Note that the insulating material 22 may be applied by means such as a screen-printing system, an ink jet printer system, chemical vapor deposition (CVD), a spray system and application by using a dispenser.

Figure 2A:
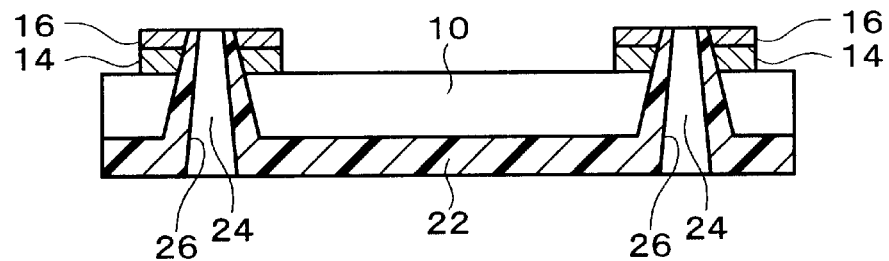
FIGS. 2A to 2C show a fabrication method of a semiconductor device according to the first embodiment of the present invention.

When the insulating material 22 buries the hole 18 as shown in FIG. 2A, a penetrating hole 24 is formed within a portion that has been the hole 18. The penetrating hole 24 is a hole for providing an electrically conductive material 40. The penetrating hole 24 is formed to a diameter smaller than that of the hole 18. This arrangement can electrically insulate the conductive material 40 applied into the penetrating hole 24 from the semiconductor chip 10. The form and the formation method of the hole 18 described already may be employed to form the penetrating hole 24. In the example shown in the drawing, the taper 26 is applied to the penetrating hole 24 so that the open width becomes progressively greater away from the pad 14.

When the insulating material 22 is formed on the inner wall surface of the hole 18, the penetrating hole 24 is formed in the area encompassed by the insulating material separately from the arrangement described above.

The conductive film 28 electrically connected to the pad 14 (metal layer 16) may be formed in advance on the inner surface of the penetrating hole 24 before the conductive material 40 is provided, as shown in FIG. 5, whenever necessary. In other words, the conductive film 28 is so formed as to extend from the pad 14 to the inner surface of the penetrating hole 24. As shown in the drawing, the conductive film 28 may be formed on the inner wall surface of the penetrating hole 24 in the proximity of the opening on the side of the pad 14. The conductive film 28 may also be formed on the pad 14 in such a fashion as to encompass the entire outer periphery of the penetrating hole 24, or to keep contact with a part of the outer periphery. The conductive film 28 can be formed by means such as sputtering or vacuum deposition. According to this means, the conductive material 40 provided within the penetrating hole 24 can be connected electrically reliably to the pad 14.

Figure 2B:
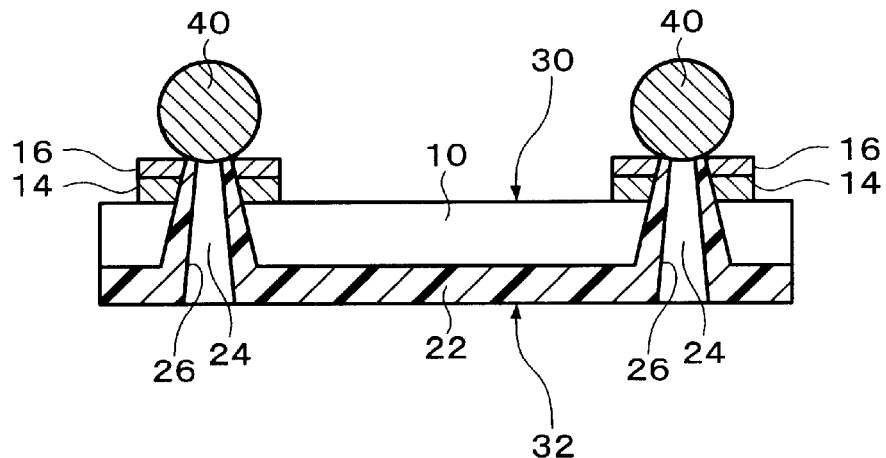

Next, as shown in FIGS. 2B to 3, the conductive material 40 is made to flow into the penetrating hole 24. The following example uses the semiconductor chip 10 having the penetrating holes 24 formed by the method described above.

Alternatively, it is possible to use a semiconductor chip fabricated by another method and provide the conductive material 40 in the penetrating hole of the semiconductor chip. In other words, the method of forming the penetrating hole is not limited in this embodiment. For example, it is possible to employ a method that forms a thin small hole penetrating through the semiconductor chip 10 and then expands the small hole by wet etching to form the penetrating hole. In such a case, the penetrating hole may be formed in such a fashion that the diameter of its intermediate part is greater than the diameter of the open-end portion.

Next, the conductive material 40 is provided at the open-end portion of the penetrating hole 24 on the side of the surface of the semiconductor chip 10 (first surface 30) as shown in FIG. 2B. In other words, the conductive material 40 may be provided on a surface of the semiconductor chip 10 having the pad 14. When the penetrating hole 24 is formed in the pad 14, the conductive material 40 is provided on each pad 14. Alternatively, the conductive material 40 may be provided on a surface of the semiconductor chip 10 opposite to the surface having the pad 14.

The conductive material 40 may be formed of a single or plurality of metal elements, and the material is not limited so long as it has electric conductivity. The conductive material maybe a conductive resin, for example. The conductive material 40 includes not only those which remain solid at a normal temperature but also those which have fluidity at a normal temperature.

In the case of the solid, the shape of the conductive material 40 is not limited, and the shape may be a sphere, a hemi-sphere, a rectangle (including a cube) and other polyhedrons. The solid conductive material 40 may be shaped into a continuous shape such as a wire. In such a case, the conductive material need not be provided for each of a plurality of penetrating holes 24.

A wire bonding technology used in fabrication methods of semiconductor devices may be applied to obtain the wire-shaped conductive material. In other words, a capillary (not shown) through which the wire-shaped conductive wire is passed is arranged on the semiconductor chip 10 (while it is laid down horizontally, for example), and the conductive wire is continuously fed out from the distal end of the capillary. In such a case, the conductive wire at the distal end of the capillary is fused into a ball shape by using laser, and is arranged on the penetrating hole 24 by controlling the position of the capillary. At this time, the ball-like conductive material may be sucked into the penetrating hole 24 by controlling a pressure difference as will be described later while it is placed on the penetrating hole 24 or while it is kept above the penetrating hole 24 in the spaced-apart relation. Since this method need not use the ball-like conductive material having a small diameter, a semiconductor device can be fabricated at a low cost of production through a simple fabrication process.

When the conductive material 40 has fluidity, the conductive material 40 preferably has high viscosity to such an extent that when it is provided above the penetrating hole 24, its fluidization into the penetrating hole 24 can be prevented.

In the example shown in FIG. 2B, the conductive material 40 is a solid metal sphere. The metal sphere has a volume capable of establishing electric connection with at least the surface and back of the semiconductor chip 10. The metal sphere has a volume capable of filling at least the penetrating hole 24, for example. The metal sphere includes not only the sphere but also those whose surface is formed by curve surfaces such as an ellipse. The diameter of the metal sphere is preferably greater than the open width of the penetrating hole 24 on the side of the first surface 30. Any metal sphere is put on the respective penetrating hole 24. More specifically, a part of the metal sphere is fitted into the opening of the penetrating hole 24 so as to position the metal sphere to the penetrating hole 24. Since the solid metal sphere is merely put in this case, the stress resulting from pressurization does not act on the semiconductor chip 10, and the semiconductor chip 10 is not damaged. The metal sphere may close the opening of the penetrating hole 24. When this method is employed, a pressure difference can be easily created between the side of the first surface 30 and the side of the second surface 32 including the inner surface of the penetrating hole 24 as will be described later. The metal sphere may be made of Au (80%)-Sn (20%), Sn (90%)-Ag (10%), or Bi (97.5%)-Ag (2.5%).

The melting point of the conductive material 40 is not limited, and may be from about 250 to about 300° C., for example. However, the melting point of the conductive material 40 is preferably higher than the heating temperature of the semiconductor chip 10 in subsequent process steps. For example, the melting point of the conductive material 40 is preferably higher than the temperature for re-flowing external terminals (see FIG. 10) provided to the semiconductor device. For, the conductive material 40 is prevented from re-melting in subsequent process steps. In consequence, the outflow of the conductive material 40 from the penetrating hole 24 can be prevented in the fabrication process.

Figure 2C:
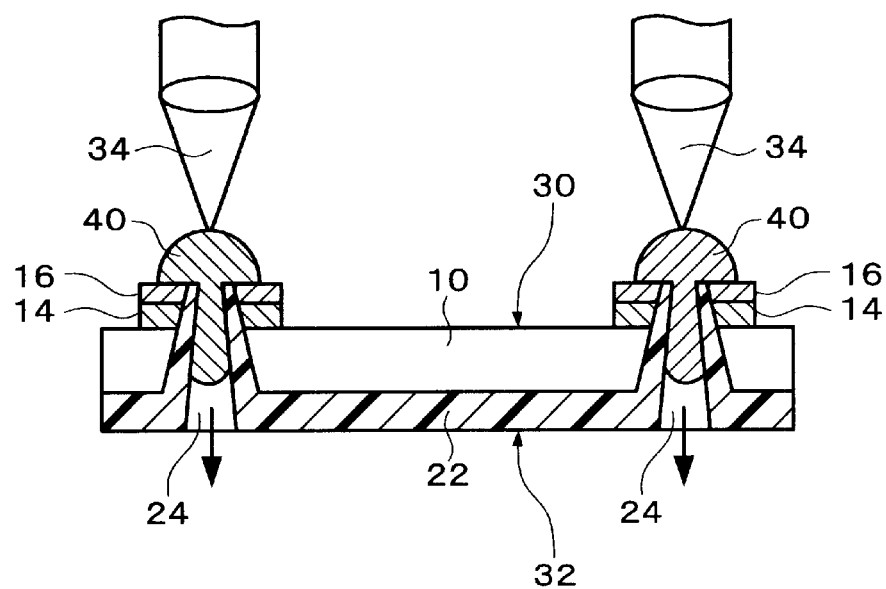

The conductive material 40 is melted as shown in FIG. 2C. In the example shown in the drawing, a laser beam 34 is irradiated to melt the conductive material 40. In other words, the conductive material 40 is locally heated by using the laser heating method. Since local heating can be made in this way, the semiconductor chip 10 is prevented from being heated to a high temperature. Therefore, the semiconductor chip 10 is prevented from being damaged by heating.

The laser beam 34 maybe irradiated from the first surface 30 on the side in which the conductive material 40 is provided or from the second surface 32 opposite to the first surface 30. When the laser beam 34 is irradiated from the second surface 32, the laser beam 34 is irradiated through the penetrating hole 24. Alternatively, the laser beams 34 may be irradiated from both sides of the first and second surfaces 30 and 32 (either simultaneously or sequentially). This method can uniformly melt the conductive material 40 as a whole. Being melted, the conductive material 40 is allowed to flow into the penetrating hole 24.

After the heating temperature of the conductive material 40 is set, laser power is controlled so that the laser beam 34 reaches the set temperature. This method can heat the conductive material 40 at the correct temperature, and can control the flow of the conductive material 40 with a high level of accuracy.

When the laser beam 34 is irradiated to a plurality of conductive materials 40, it is further possible to split the laser beam 34 into a plurality of beams by using a phase grating and to collectively irradiate these laser beams 34 to the conductive materials 40 provided in a plurality of penetrating holes 24. This method has high productivity because it can collectively process the conductive material 40 provided at a plurality of positions.

To make the molten conductive material 40 flow into the penetrating hole 24, the pressure difference is controlled between the side of the first surface 30 and the side of the second surface 32 opposite to the first surface 30. More specifically, the atmospheric pressure on the side of the second surface 32 is set to a pressure relatively lower than the atmospheric pressure on the side of the first surface 30. In this way, the conductive material 40 is allowed to flow into the penetrating hole 24 toward the second surface 32.

For example, the atmospheric pressure on the side of the second surface 32 may be reduced from the normal atmospheric pressure. In other words, the molten conductive material 40 may be sucked from the side of the second surface 32 through the penetrating hole 24. If the atmospheric pressure on the side of the second surface 32 is lowered, the conductive material 40 can be sucked simultaneously from a plurality of penetrating holes 24. Therefore, the molten conductive material 40 at a plurality of positions can be easily made to flow into the penetrating holes 24.

Alternatively, the atmospheric pressure on the side of the first surface 30 may be pressurized to be higher than the normal atmospheric pressure. Since the molten conductive material 40 at a plurality of positions is simultaneously pressurized from the side of the first surface 30, the conductive material 40 can be easily made to flow into the penetrating holes 24. Note that the atmospheric pressure on the side of the first surface 30 may be increased and at the same time, the atmospheric pressure on the side of the second surface 32 may be decreased. In other words, atmospheric pressure on both sides may be simultaneously controlled.

The step of controlling atmospheric pressure difference between the side of the first surface 30 and the second surface 32 may be carried out before the conductive material 40 is melted. In other words, a predetermined atmospheric pressure difference has been previously created between the first and second surfaces 30 and 32 before the conductive material 40 is melted. This enables to control the flow of the conductive material 40 only by setting the power and irradiation time of the laser beam 34.

As the conductive material 40 is made to flow by the control of the atmospheric pressure difference between the first and second surfaces 30 and 32, the conductive material 40 can be smoothly made to flow within a short time even if the wettability on the inner surface of the penetrating hole 24 to the conductive material 40 (solder, for example) is small. Therefore, the material of the inner surface of the penetrating hole 24 can be selected without considering the wettability to solder or the like.

Alternatively, as shown in FIG. 6, a solid conductive material 40 may be placed over the penetrating hole 24 by utilizing the atmospheric pressure difference between the first and second surfaces 30 and 32 before the conductive material 40 is melted. When the atmospheric pressure difference is created between the first and second surfaces 30 and 32 as shown in the drawing, a gas stream develops toward the inner surface of the penetrating hole 24 on the side of the first surface 30. In consequence, this gas stream can automatically place the conductive material 40 on the penetrating hole 24 only by providing the conductive material 40 near the penetrating hole 24. It becomes thus possible through a simple step to place the conductive material 40 on the penetrating hole 24 without a positioning error.

The conductive material 40 may flow until it protrudes from the penetrating hole 24 to thereby form a bump 46, as shown in FIG. 3. The bump 46 protrudes also from the second surface 32. The bump 46 may be formed on a surface opposite to the pad 14. The bump 46 can be formed by controlling the parameters such as the quantity and fluidity of the conductive material 40, the atmospheric pressure difference between the first and second surfaces 30 and 32, or power and the irradiation time of the laser beam 32. More specifically, these parameters are controlled so that a surface tension can be created in a bottom surface of the molten conductive material 40 outside the penetrating hole 24.

Another bump 42 protruding from the first surface 30 may be formed outside the penetrating hole 24 in place of, or simultaneously with, the formation of the bump 46. The bump 42 is formed over the penetrating hole 24, that is, over the pad 14 (metal layer 16). When the bumps are formed on both sides of the semiconductor chip 10, the bump 42 is electrically connected to the bump 46 through the intermediate part 44 of the conductive material 40 put into the penetrating hole 24. The bump 42 is preferably shaped so that it can be electrically connected to the pad 14. More specifically, the bump 42 has a diameter greater than the diameter of the hole 18 in which the insulating material 22 is provided, as viewed from a direction perpendicular to the first surface 30. In consequence, the conductive material 40 can be provided in the penetrating hole 24 and electrically connected to the pad 14. Therefore, a step of applying a conductive paste or the like onto the pad 14 for electrically connecting the conductive material 40 to the pad 14 can be omitted.

Alternatively, the conductive material 40 may be made to flow into the penetrating hole 24 without forming the bumps 42 and 46. In this case, if the conductive material 40 is provided in the penetrating hole 24 without any gap, the mechanical strength of the semiconductor chip 10 can be improved. Note that the conductive material 40 is not necessarily be provided in the penetrating hole 24 without any gap, but may flow into the penetrating hole 24 to such an extent that the conduction between both surfaces of the semiconductor chip 10 can be established.

As shown in FIG. 7, a bump 246 may be formed as to satisfy the relation: A<B between the diameter A of the bump 246 formed of the conductive material 240 and protruding from the second surface 32 and the diameter B of the hole 18 in which an insulating material 222 is provided on an inner surface. This configuration is effective when the insulating material 222 is provided only on the inner surface of the hole 18, as shown in the drawings. In other words, this makes it possible to prevent the electrical conduction between the bump 246 protruding from the hole 18 and the semiconductor chip 10 when the insulating material 222 is not provided on the side opposite to the pad 14 of the semiconductor chip 10. Moreover, since the insulating material 222 is not required to be extended to the surface of the semiconductor chip 10, the amount of the insulating material 222 can be reduced.

It is further possible to stack a plurality of semiconductor devices 1 and to electrically connect the upper and lower semiconductor chips 10 through the conductive material 40 as shown in FIG. 4. In other words, a semiconductor device having a three-dimensional configuration is fabricated. As shown in this drawing, each semiconductor chip 10 may be stacked in such a fashion that the surface having the pads 14 faces in the same direction. Alternatively, the semiconductor chip 10 may be stacked in such a fashion that the surface having the pads 14 opposes one another, or the surface opposite to the surface having the pads 14 opposes one another.

When each semiconductor device 1 has the bumps 46, the upper and lower semiconductor chips 10 may be electrically connected with one another by using the bumps 46. This configuration eliminates the necessity for forming the external terminals and can therefore simplify the fabrication steps.

Separately from the example shown in the drawing, the external terminals (of a brazing material such as the solder) may be provided to the bump 46 of the semiconductor chip 10 (the portion of the conductive material 40 exposed to the opening of the penetrating hole 24 when the bump 46 is not formed). Particularly when the bump 46 is formed on the semiconductor chip 10, the external terminal can be connected electrically reliably to the conductive material 40. When the external terminal is provided, each semiconductor chip 10 can be connected electrically reliably. Note that the external terminal may be provided to only the semiconductor chip 10 of the lowermost stage that is directly mounted to the circuit board.

Alternatively, it is possible to employ the configuration in which the semiconductor chips 10 are stacked in such a fashion that the upper and lower penetrating holes 24 overlap plane-wise with one another, to arrange the conductive material 40 over the penetrating hole 24 formed in the semiconductor chip 10 of the uppermost stage, and to melt the conductive material 40 so as to let it flow into a plurality of penetrating holes 24 of the upper and lower stages. This configuration makes it possible to collectively provide the conductive material 40 in the penetrating holes 24 of a plurality of semiconductor chips 10 and to electrically connect the upper and lower semiconductor chips 10.

According to the fabrication method of the semiconductor device in this embodiment, the molten conductive material 40 is made to flow into the penetrating holes 24 toward the second surface 32 when the atmospheric pressure on the side of the second surface 32 is lower than that of the side of the first surface 30. Since this method causes the molten conductive material 40 to flow while controlling the atmospheric pressure difference, the conductive material 40 can be provided in the penetrating holes 24 in a short time. Since this method puts the conductive material 40 over the penetrating holes 24 and then melts it, the process step is simple.

Next, a semiconductor device according to this embodiment will be described. As shown in FIG. 3, the semiconductor device 1 includes a semiconductor chip 10 having penetrating holes 24 and a conductive material 40 provided in an area inclusive of the inner surface of each penetrating hole 24. Part of the conductive material 40 protrudes from a surface (second surface) opposite to the surface (first surface 30) of the semiconductor chip 10 on which pads 14 are formed.

As shown in FIG. 4, this semiconductor device 3 includes a plurality of semiconductor devices 1 that are stacked one upon another. Each semiconductor chip 10 is electrically connected with others through the conductive material 40. Note that the rest of the components of these semiconductor devices 1 and 3 are described in the above fabrication method.

When part of the conductive material 40 provided in the penetrating hole 24 protrudes from the surface of the semiconductor chip 10 in these semiconductor devices, the protruding portion (bump 46) is used as the external terminal and by so doing, the number of components of the semiconductor devices can be decreased. Therefore, the semiconductor devices can be provided at a reduced cost of production.

Second Embodiment

Figure 8A:
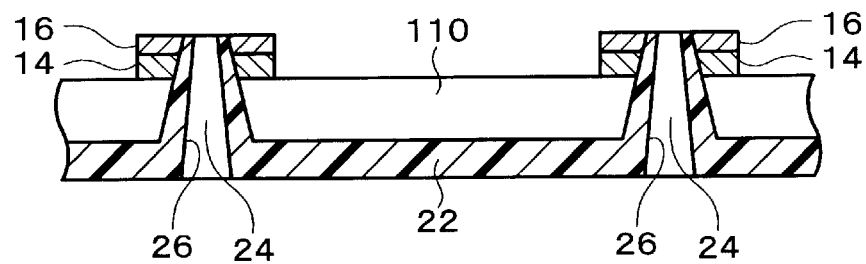
FIGS. 8A to 8C show a fabrication method of a semiconductor device according to the second embodiment of the present invention.
Figure 8B:
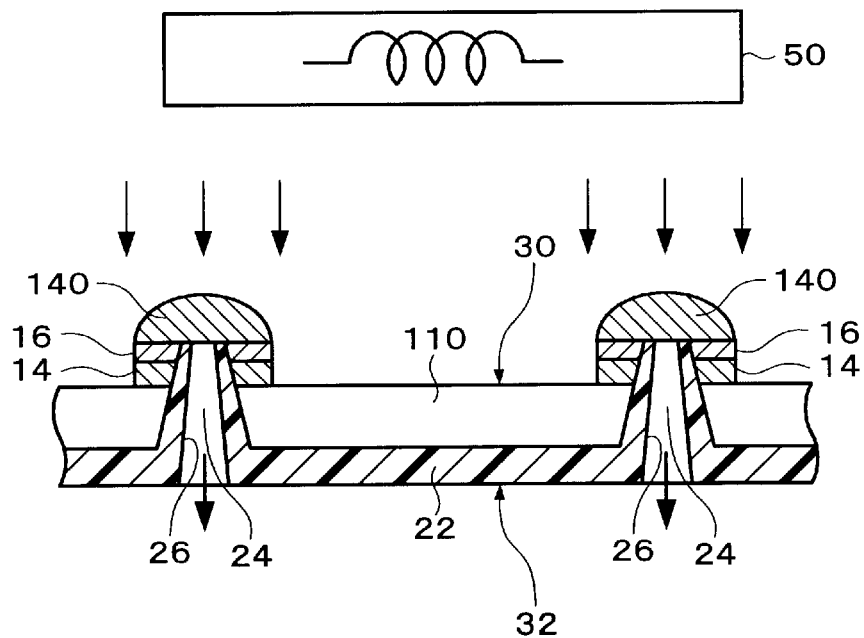
Figure 8C:
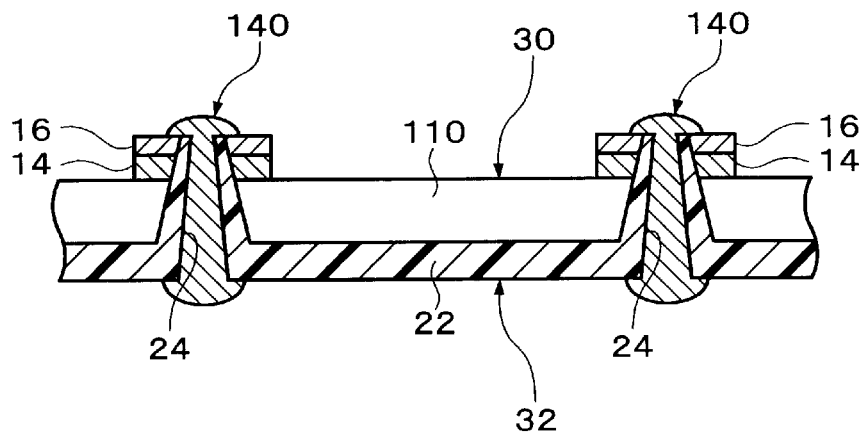

FIGS. 8A to 8C show a fabrication method of a semiconductor device according to the second embodiment of the invention. The technical content of the first embodiment can be applied as much as possible to this embodiment. In this embodiment, a conductive material 140 is made to flow into penetrating holes 24 of a semiconductor wafer 110.

As shown in FIG. 8A, the semiconductor wafer 110 (semiconductor chip) is first prepared. The semiconductor wafer 110 has a plurality of penetrating holes 24. The form and the formation method of the penetrating holes 24 of the foregoing examples can be applied.

The conductor material 140 is placed on the first surface 30 of the semiconductor wafer 110 above the penetrating holes 24 as shown in FIG. 8B. The conductor material 140 is paste-like such as a solder paste. The conductor material 140 may be applied by means such as a screen-printing system and application by using a dispenser. Particularly when the dispenser is used, the conductive material 140 can be applied without imparting damage to the semiconductor wafer 110. The conductive material 140 may be applied also by using an ink jet system. According to this system, the conductive material 140 can be applied at a high speed and economically without waste.

The conductive material 140 may be provided at a plurality of positions where the penetrating holes 24 are formed as shown in the drawing, or may be integrally provided in an area inclusive of a plurality of penetrating holes 24. In the latter case, the conductive material 140 may be provided in such a fashion as to cover the first surface 30 of the semiconductor wafer 110. According to this method, the conductive material 140 can be easily provided without taking the correct positions into consideration.

After provided, the conductive material 140 is melted. In the example shown in the drawing, the conductive material 140 is heated by using a heater 50. The heater 50 may use infrared rays, for example, or may have a known configuration such as the one in which hot wind, high temperature atmosphere (e.g. $N_2$ re-flow oven) or heated jig is brought into contact with the conductive material 140. When the heater 50 heats the semiconductor wafer 110, the conductive material 140 provided over a plurality of penetrating holes 24 can be simultaneously melted. Therefore, the heating step is simple. The heater 50 may be provided on the side of the first surface 30 of the semiconductor wafer 110 or on the side of the second surface 32 or on both sides.

To make the molten conductive material 140 flow into the penetrating holes 24, the atmospheric pressure difference between the first and second surfaces 30 and 32 is controlled. The detail of this control is described in the first embodiment.

The conductive material 140 can be provided in this way in the penetrating holes 24 as shown in FIG. 8C. When the conductive material 140 is provided integrally in the area inclusive of a plurality of penetrating holes 24 (such as the entire part of the first surface 30), washing is thereafter carried out. In other words, the conductive material 140 applied to portions other than the penetrating hole 24 area is removed from among the conductive material 140 remaining on the first surface 30.

After the conductive material 140 is thus provided in the penetrating holes 24, the semiconductor wafer 110 is diced and split into a plurality of semiconductor chips. Alternatively, after a plurality of semiconductor wafers 110 is stacked in a vertical direction, a plurality of the upper and lower semiconductor wafers 110 may be diced simultaneously.

The fabrication method of the semiconductor device according to this embodiment can be conducted by selecting any of the technical contents described in the first embodiment. For example, a solid conductive material (such as metal spheres) may be provided on the semiconductor wafer 110, or a paste-like conductive material 140 may be melted by the irradiation of laser beams. The technical content of this embodiment may also be applied to the semiconductor chip described in the first embodiment.

The second embodiment of the present invention can accomplish the effects described in the first embodiment.

Third Embodiment

Figure 9A:
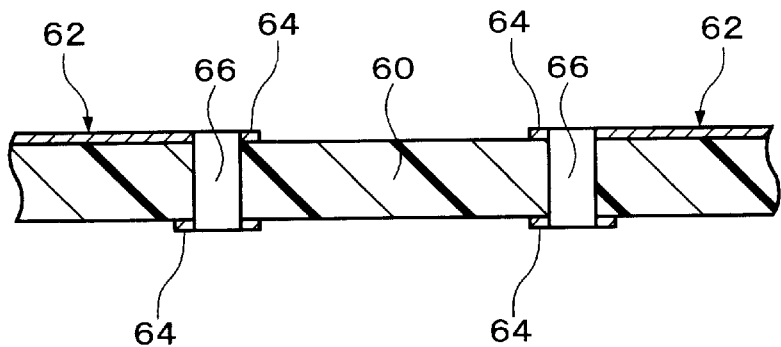
FIGS. 9A to 9C show a fabrication method of a semiconductor device according to the third embodiment of the present invention.
Figure 9B:
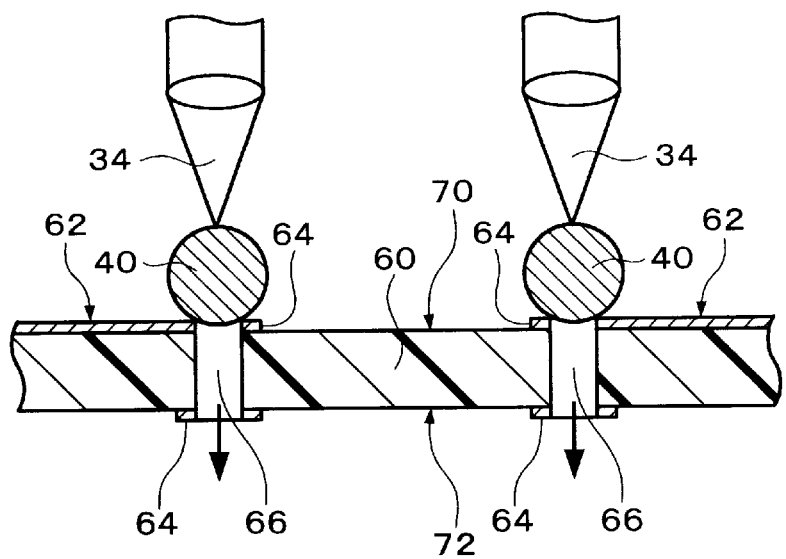
Figure 9C:
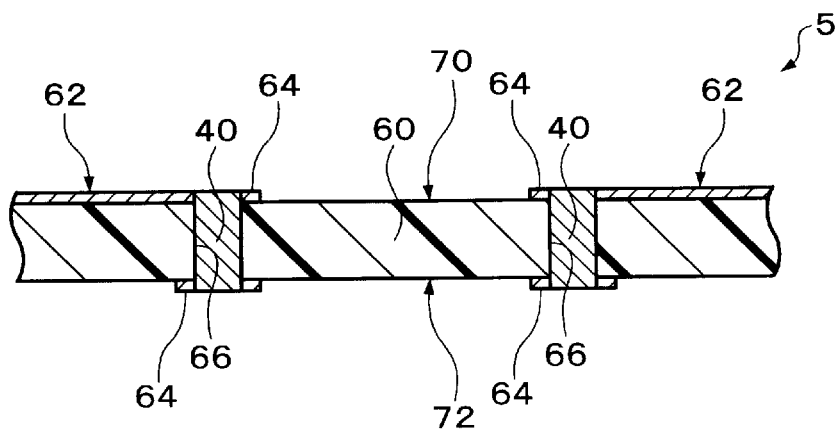

FIGS. 9A to 9C show a fabrication method of a semiconductor device according to the third embodiment of the present invention. The technical content of the first and second embodiments can be applied as much as possible to this embodiment. In this embodiment, a conductive material 40 is provided in penetrating holes 66 of a board 60.

A board 60 is first prepared as shown in FIG. 9A. The board 60 may be made of an organic material (resin type) or an inorganic material (ceramic type, metal type) or their composite system. The board 60 may use a glass epoxy board or a polyimide board, for example. The overall shape of the board 60 is not limited, but is in most cases similar to the planar shape of the semiconductor chip 10. The thickness of the board 60 is decided in accordance with its material and is not particularly limited. The board 60 may have a single layer or multiple layers.

An interconnecting pattern 62 is formed on the board 60. The interconnecting pattern 62 includes in most cases a plurality of layers of copper, nickel or gold. The interconnecting pattern 62 may be formed on both surfaces of the board 60 as shown in the drawing or on only one of the surfaces.

The interconnecting pattern 62 includes in most cases lands 64 (or pads). The land 64 has a width greater than that of a line connected thereto. The shape of the land 64 may be circular. In this case, the land 64 has a diameter greater than the width of the line. Alternatively, the interconnecting pattern of only lines may be formed on the board 60 without forming the lands 64.

The board 60 may be an interposer for a semiconductor package or a board for MCM (Multi-Chip Module) or a board for a motherboard, and its application is not limited. The board 60 may further be a build-up multi-layered printed wiring board.

Penetrating holes 66 are formed in the board 60. When the lands 64 are formed, the penetrating holes 66 are formed to penetrate the lands 64. According to this arrangement, the conductive material 40 can be electrically connected to the interconnecting pattern 62 as it is allowed to flow into the penetrating holes 66. In the example shown in the drawing, the lands 64 are formed on both surfaces of the board 60 in such a fashion as to superpose plane-wise with one another, and the penetrating hole 66 is formed in such a fashion as to open the center of the land 64 on each surface.

As described, a conductive film extending from the land 64 into the penetrating hole 66 may be formed before the conductive material 40 is provided. The conductive film can connect electrically reliably the land 64 and the conductive material 40.

The conductive material 40 is provided on the first surface 70 of the board 60 above the penetrating hole 66 as shown in FIG. 9B. The composition of the conductive material 40 is described in the first embodiment. In the example shown in the drawing, a solid metal sphere is placed over the penetrating hole 66, and the laser beam 34 is irradiate the metal sphere to melt it. The atmospheric pressure on the side of the second surface 72 opposite to the first surface 70 is reduced to be relatively lower than the atmospheric pressure on the side of the first surface 70 so that the conductive material 40 can be made to flow toward the second surface 72 through the penetrating hole 66.

Alternatively, the conductive material may use a paste-like material. A heater may be used to melt the conductive material 40. In such a case, the board 60 may be heated. These technical contents are the same as those described in the second embodiment.

The conductive material 40 flows into the penetrating hole 66, as shown in FIG. 9C. Since the penetrating hole 66 of the board 60 is filled, the mechanical strength of the board 60 can be improved. The conductive material 40 may be provided in the penetrating hole 66 as shown in the drawings, or may be provided to form a bump outside the penetrating hole 66.

The third embodiment of the present invention can accomplish the same effect as described in the first and second embodiments. The configuration of the wiring board 5 in this embodiment is as described above.

Figure 10:
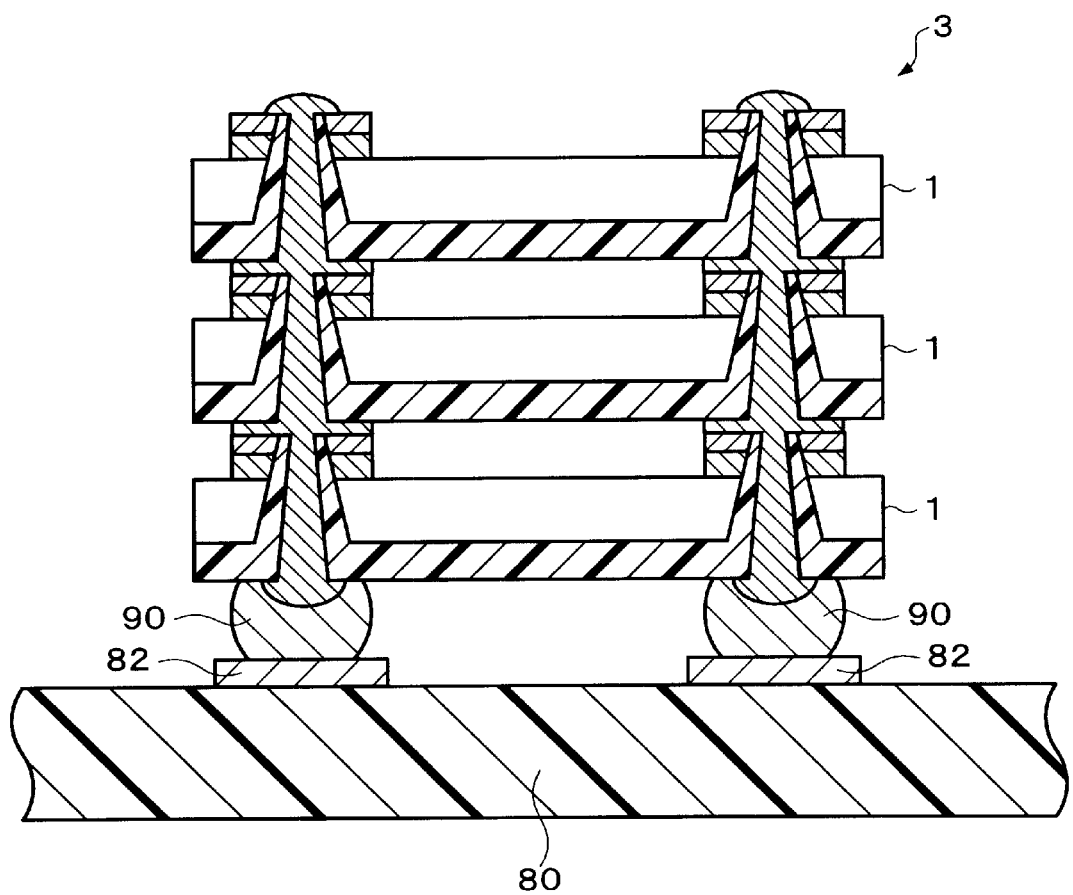
FIG. 10 shows a circuit board to which a semiconductor device according to one embodiment of the present invention is mounted.

FIG. 10 shows a circuit board 80 over which the semiconductor device 3 described in the first embodiment is mounted. The circuit board 80 may be a mother board. An organic board such as a glass epoxy board or a polyimide film, or a glass board such as a liquid crystal display board is generally used for the circuit board 80. An interconnecting pattern 82 made of copper, for example, is formed on the circuit board 80 to obtain a desired circuit, and is electrically connected to the semiconductor device 3. The semiconductor device 3 may be electrically connected to the circuit board 80 by mechanically connecting external terminals 90 to the interconnecting pattern 82, for example.

Figure 11:
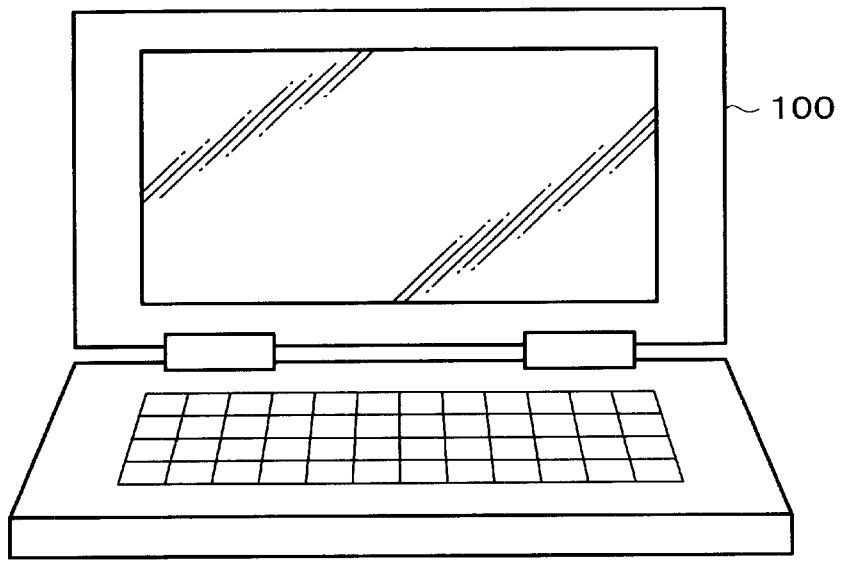
FIG. 11 shows an electronic instrument having a semiconductor device according to one embodiment of the present invention.
Figure 12:
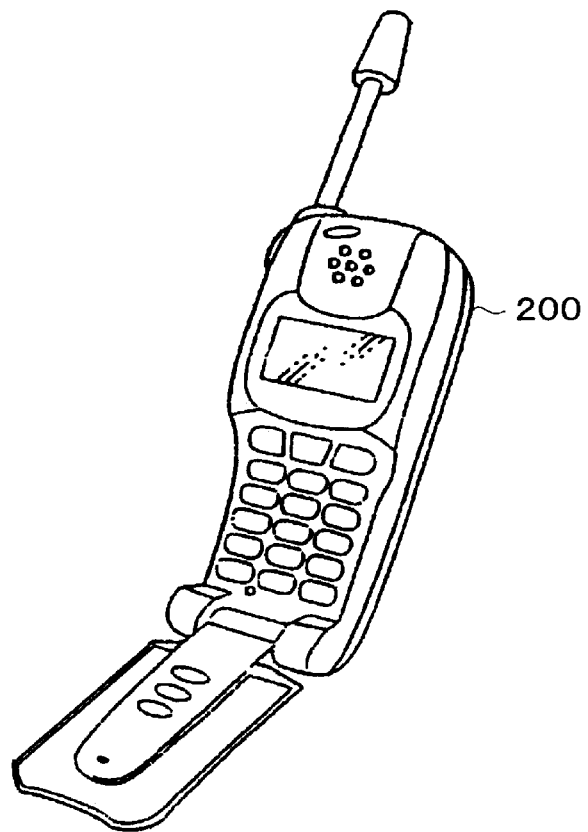
FIG. 12 shows an electronic instrument having a semiconductor device according to one embodiment of the present invention.

As examples of electronic instruments including the semiconductor device 3 to which the present invention is applied, there are a notebook computer 100 shown in FIG. 11 and a cellular phone 200 shown in FIG. 12.

What is claimed is:

1. A method of fabricating a semiconductor device comprising the steps of:

providing a conductive material to an open end of a penetrating hole penetrating through at least a semiconductor element, on the side of a first surface of the semiconductor element; and melting the conductive material to make the conductive material flow into the penetrating hole, wherein the conductive material is made to flow into the penetrating hole in a state that an atmospheric pressure on the side of a second surface of the semiconductor element opposite to the first surface is lower than an atmospheric pressure on the side of the first surface.

2. The method of fabricating a semiconductor device as defined in claim 1, wherein the semiconductor element has a pad formed on the first surface; and wherein the penetrating hole penetrates through the pad.

3. The method of fabricating a semiconductor device as defined in claim 2, wherein a conductive film extending from the pad into an inner surface of the penetrating hole is formed before the conductive material is provided.

4. The method of fabricating a semiconductor device as defined in claim 1, wherein the conductive material is a solid, and the solid conductive material is placed over the open end of the penetrating hole on the side of the first surface.

5. The method of fabricating a semiconductor device as defined in claim 1, wherein the conductive material is paste-like, and the paste-like conductive material is applied to the open end of the penetrating hole on the side of the first surface.

6. The method of fabricating a semiconductor device as defined in claim 5, wherein the paste-like conductive material is applied to the first surface of the semiconductor element.

7. The method of fabricating a semiconductor device as defined in claim 1, wherein a laser beam is projected onto the conductive material to melt the conductive material.

8. The method of fabricating a semiconductor device as defined in claim 1, wherein the semiconductor element is heated to melt the conductive material.

9. The method of fabricating a semiconductor device as defined in claim 1, wherein the conductive material is made to flow in a state that an atmospheric pressure on the side of the first surface of the semiconductor element is higher than normal atmospheric pressure.

10. The method of fabricating a semiconductor device as defined in claim 1, wherein the conductive material is made to flow in a state that an atmospheric pressure on the side of the second surface of the semiconductor element is lower than normal atmospheric pressure.

11. The method of fabricating a semiconductor device as defined in claim 1, wherein the conductive material is made to flow through the penetrating hole and protrude from the second surface into a bump.

12. The method of fabricating a semiconductor device as defined in claim 11, wherein the penetrating hole is formed as a hole in the semiconductor element, an inner wall of the hole being covered by an insulating material; and wherein the diameter of the bump is smaller than the diameter of the hole.

13. The method of fabricating a semiconductor device as defined in claim 1, wherein the semiconductor element is a semiconductor wafer.

14. A method of fabricating a stacked type semiconductor device comprising the steps of:

forming a plurality of semiconductor devices each of which is formed by: providing a conductive material to an open end of a penetrating hole penetrating through at least a semiconductor element, on the side of a first surface of the semiconductor element; melting the conductive material to make the conductive material flow into the penetrating hole; and causing the conductive material to flow into the penetrating hole in a state that an atmospheric pressure on the side of a second surface of the semiconductor element opposite to the first surface is lower than an atmospheric pressure on the side of the first surface;

stacking the plurality of the semiconductor devices; and electrically connecting the semiconductor elements of the stacked semiconductor devices through the conductive material.

15. A semiconductor device fabricated by the method as defined in claim 1.

16. A stacked type semiconductor device fabricated by the method as defined in claim 14.

* * * * *